(12) United States Patent
Ding et al.

(10) Patent No.: US 11,404,290 B2
(45) Date of Patent: Aug. 2, 2022

(54) METHOD AND APPARATUS FOR PULSE GAS DELIVERY

(71) Applicant: MKS Instruments, Inc., Andover, MA (US)

(72) Inventors: Junhua Ding, Boxborough, MA (US); Michael L'Bassi, Sterling, MA (US)

(73) Assignee: MKS Instruments, Inc., Andover, MA (US)

( * ) Notice: Subject to any disclaimer, the term of this patent is extended or adjusted under 35 U.S.C. 154(b) by 38 days.

(21) Appl. No.: 16/376,861

(22) Filed: Apr. 5, 2019

(65) Prior Publication Data

US 2020/0321225 A1 Oct. 8, 2020

(51) Int. Cl.
*G05B 15/02* (2006.01)
*H01L 21/67* (2006.01)
*G05D 7/06* (2006.01)

(52) U.S. Cl.
CPC ........ *H01L 21/67017* (2013.01); *G05B 15/02* (2013.01); *G05D 7/0647* (2013.01)

(58) Field of Classification Search
None
See application file for complete search history.

(56) References Cited

U.S. PATENT DOCUMENTS

| | | | | |
|---|---|---|---|---|
| 6,119,710 A * | 9/2000 | Brown | ...................... | G01F 1/50 137/14 |
| 6,247,493 B1 * | 6/2001 | Henderson | ........... | G05D 7/0641 137/12 |
| 6,913,031 B2 * | 7/2005 | Nawata | ................ | G05D 7/0635 137/12 |
| 7,615,120 B2 | 11/2009 | Shajii et al. | | |
| 7,628,860 B2 | 12/2009 | Shajii et al. | | |
| 7,829,353 B2 | 11/2010 | Shajii et al. | | |
| 9,557,744 B2 | 1/2017 | Ding | | |
| 2001/0002581 A1 * | 6/2001 | Nishikawa | ........ | H01L 21/67017 118/715 |
| 2004/0083961 A1 | 5/2004 | Basceri | | |
| 2004/0226507 A1 * | 11/2004 | Carpenter | ............... | C23C 16/52 118/715 |
| 2005/0223979 A1 | 10/2005 | Shajii et al. | | |

(Continued)

FOREIGN PATENT DOCUMENTS

KR 10-2012-0019508 A 3/2012
WO WO2011/047361 A1 4/2011

(Continued)

OTHER PUBLICATIONS

PCT International Search Report and Written Opinion for International Application No. PCT/US2020/024980, entitled "Method and Apparatus for Pulse Gas Delivery," dated Aug. 14, 2020.

*Primary Examiner* — Jason Lin
(74) *Attorney, Agent, or Firm* — Hamilton, Brook, Smith & Reynolds, P.C.

(57) ABSTRACT

In a pulse gas delivery system, a chamber is pre-charged to a prescribed pressure through an upstream valve. Thereafter, a downstream control valve is opened to control flow of the gas during a gas pulse. A dedicated controller may control the downstream control valve in a feedback loop during the pulse based on pressure and temperature detected during the pulse.

27 Claims, 8 Drawing Sheets

(56) References Cited

U.S. PATENT DOCUMENTS

| | | | |
|---|---|---|---|
| 2006/0130744 A1* | 6/2006 | Clark | C23C 16/45544 |
| | | | 117/86 |
| 2006/0283254 A1* | 12/2006 | Ding | G01F 25/0053 |
| | | | 73/700 |
| 2007/0233412 A1 | 10/2007 | Gotoh et al. | |
| 2008/0191153 A1 | 8/2008 | Marganski et al. | |
| 2010/0167527 A1* | 7/2010 | Wu | C23C 16/14 |
| | | | 257/E21.295 |
| 2011/0108126 A1 | 5/2011 | Monkowski et al. | |
| 2011/0311726 A1 | 12/2011 | Liu et al. | |
| 2012/0216888 A1* | 8/2012 | Ding | G05D 7/0635 |
| | | | 137/561 R |
| 2014/0051261 A1* | 2/2014 | Ota | C23C 16/45523 |
| | | | 438/770 |
| 2014/0083514 A1* | 3/2014 | Ding | G01F 25/0007 |
| | | | 137/12 |
| 2014/0190571 A1 | 7/2014 | Ding et al. | |
| 2014/0343875 A1* | 11/2014 | Spyropoulos | G01F 1/34 |
| | | | 702/47 |
| 2020/0033895 A1* | 1/2020 | Sugita | G01F 1/363 |
| 2020/0348704 A1* | 11/2020 | Sugita | G05D 7/0647 |

FOREIGN PATENT DOCUMENTS

| | | |
|---|---|---|
| WO | WO2012/116281 A1 | 8/2012 |
| WO | 2015/112728 A1 | 7/2015 |

* cited by examiner

METHOD AND APPARATUS FOR PULSE GAS DELIVERY

BACKGROUND

Semiconductor fabrication processes, such as atomic layer deposition (ALD) processes, can involve the delivery of several different gases and gas mixtures in various quantities over several processing steps. Generally, gases are stored in tanks at a processing facility, and gas metering systems are used to deliver metered quantities of gases from the tanks to processing tools, such as chemical vapor deposition reactors, vacuum sputtering machines and plasma etchers. Typically, components such as valves, pressure regulators, mass flow controller (MFCs), and mass flow ratio control systems are included in the gas metering system or in a flow path from the gas metering system to a processing tool.

Pulse gas delivery devices have been developed to deliver a pulsed mass flow of a gas to semiconductor process tools. High-speed processes can use pulse gas delivery to manufacture advanced, 3-D integrated circuits that include through-silicon vias (TSVs) to provide die-to-die and wafer-to-wafer interconnects.

A traditional pressure based pulse gas delivery device charges a volume to a predetermined pressure through an inlet isolation valve with an outlet isolation valve closed. Then, with the inlet valve closed, the outlet valve is opened to pass gas to the process tool until the pressure of the volume drops to another predetermined level. The mass of gas that flows through the open outlet valve is, according to the ideal gas law, dependent on the difference in pressures as the valve is opened and closed, the volume, and temperature of the gas. More recently, mass flow controllers have been adapted for pulse delivery based on a feedback loop from the flow sensor. In general, an MFC includes an inlet port, an outlet port, a mass flow sensor and a proportional control valve that is adjusted to achieve a desired mass flow. Using a fast closing control valve, the flow can be pulsed.

SUMMARY

Improvements to a pressure based pulse gas delivery system are provided. In particular, the usual on/off isolation valve downstream of the chamber is replaced with an adjustable control valve. The degree of openness of the control valve can be controlled to limit flow and enable control of the pressure based delivery during a pulse. With appropriate control, including through a feedback loop during a pulse, a prescribed dose of gas can be precisely delivered over a prescribed pulse duration.

A pulse gas delivery system comprises a chamber having a volume, a pressure sensor configured to detect a pressure of gas within the chamber, and a temperature sensor configured to detect a temperature indicative of temperature of the gas within the chamber. An upstream valve is configured to control flow of gas into the chamber. A downstream control valve is configured to control flow of the gas out of the chamber. A controller is configured to control the upstream valve and the downstream control valve to charge the chamber to an initial pressure and to thereafter control flow through the downstream control valve during the gas pulse of the gas flowing out of the chamber to control delivered dose and period of the gas pulse based on the detected pressure and temperature.

The controller may be configured to control the downstream control valve in a feedback loop to regulate the flow during the pulse based on the pressure and temperature detected during the pulse.

The controller may be further configured to calculate flow rate of the gas out of the chamber and to control the downstream control valve to regulate the flow rate of the gas out of the chamber based on the calculated flow rate and a target flow set point. The controller may be configured to calculate the flow rate Q based on the rate of pressure decay equation:

$$Q = -\frac{V \times T_{stp}}{P_{stp}} \frac{d\left(\frac{P}{T}\right)}{dt}$$

where V represents the volume of the chamber, $T_{stp}$ represents standard temperature, $P_{stp}$ represents standard pressure, P represents the pressure of the gas within the chamber, and T represents the temperature of the gas within the chamber.

The controller may be further configured to calculate a dose of the gas delivered out of the chamber and to control the downstream control valve to deliver a prescribed dose of gas during the gas pulse. The controller may calculate the dose of the gas delivered out of the chamber based on the volume of the chamber, the initial pressure of the gas within the chamber as detected by the pressure sensor when the pulse is started, pressure of the gas within the chamber as detected by the pressure sensor during the pulse, and temperature as detected by the temperature sensor during the pulse. The mole dose $\Delta n(t)$ of the gas delivered out of the chamber at a time t during the pulse may be calculated according to the function $\Delta n(t) = V \times (P_{t0} - P_t)/(R \times T_t)$ where V represents the volume of the chamber, $P_{t0}$ represents the pressure of the gas within volume when the pulse started, $P_t$ represents the pressure of the gas within the chamber at the time t during the pulse, and $T_t$ represents the temperature of the gas at the time t during the pulse.

The controller may be configured to adjust the flow rate during the pulse to achieve a prescribed pulse shape. The controller may be configured to adjust the downstream control valve to achieve a substantially constant flow rate during the pulse.

In a method for pulse gas delivery, an upstream valve is opened while the downstream control valve is closed to charge a chamber with a gas to an initial pressure. The upstream valve is closed when the initial pressure is reached. After the upstream valve is closed, the downstream control valve is opened to start a pulse of the gas flowing out of the chamber. The downstream control valve is controlled during the pulse of the gas flowing out of the chamber to deliver a prescribed dose over a prescribed period of the pulse.

A method of delivering pulse of fluid may comprise controlling the flow of fluid into the chamber with an inlet valve, detecting a pressure of gas within the chamber with a pressure sensor, detecting a temperature indicative of temperature of the gas within the chamber with a temperature sensor, and controlling flow of fluid through a downstream control valve during the pulse of fluid.

Pressure and temperature of the gas within the chamber may be detected and the downstream control valve controlled based on the detected pressure and temperature. The downstream control valve may be closed when the prescribed dose or prescribed period of the pulse is reached. The steps of the method may be repeated under control of a dedicated controller for a prescribed number of pulses.

Flow rate of gas out of the chamber may be measured and, during the pulse, the downstream control valve may be controlled to adjust the measured flow rate to a flow setpoint. Also during the pulse, a dose of gas delivered out of the chamber may be computed and the downstream control valve may be controlled to deliver a prescribed dose of gas during the prescribed pulse time.

During the pulse, flow rate may be adjusted to achieve the prescribed pulse shape. The downstream control valve may be adjusted during the pulse to achieve a substantially constant flow rate during the pulse.

Flow of fluid through the downstream control valve may be controlled based on feedback from the pressure and the temperature detected during the pulse. Flow rate of the gas out of the chamber may be calculated, and the downstream control valve may be controlled to regulate the flow rate of the gas out of the chamber based on the calculated flow rate and a targeted flow set point.

The method may comprise calculating a dose of the gas delivered out of the chamber and controlling the downstream control valve to deliver a prescribed dose of gas during the gas pulse.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

Gas control systems are provided for pulse delivery of a specific mass of gas, e.g. a process gas in a semiconductor manufacturing process or chemical process.

The mass of gas may be specified as a desired number of moles of a fluid to be delivered during a pulse of fluid being delivered to a process chamber. The 'mole' is the unit of measurement for amount of substance in the International System of Units (SI) having a unit symbol mol. A 'mole' is defined as the amount or sample of a substance that contains as many constitutive particles, e.g., atoms, molecules, ions, electrons, or photons, as there are atoms in 12 grams of carbon-12 (12C), the isotope of carbon with standard atomic weight 12 by definition. This number is expressed by the Avogadro constant, which has a value of approximately 6.022140857×10^23 mol−1. The mole is widely used as a convenient way to express amounts of reactants and products of chemical reactions. The molar volume (symbol $V_m$) is the volume occupied by one mole of a substance at a given temperature and pressure. It is equal to the molar mass (M) divided by the mass density ($\rho$).

Figure 1:
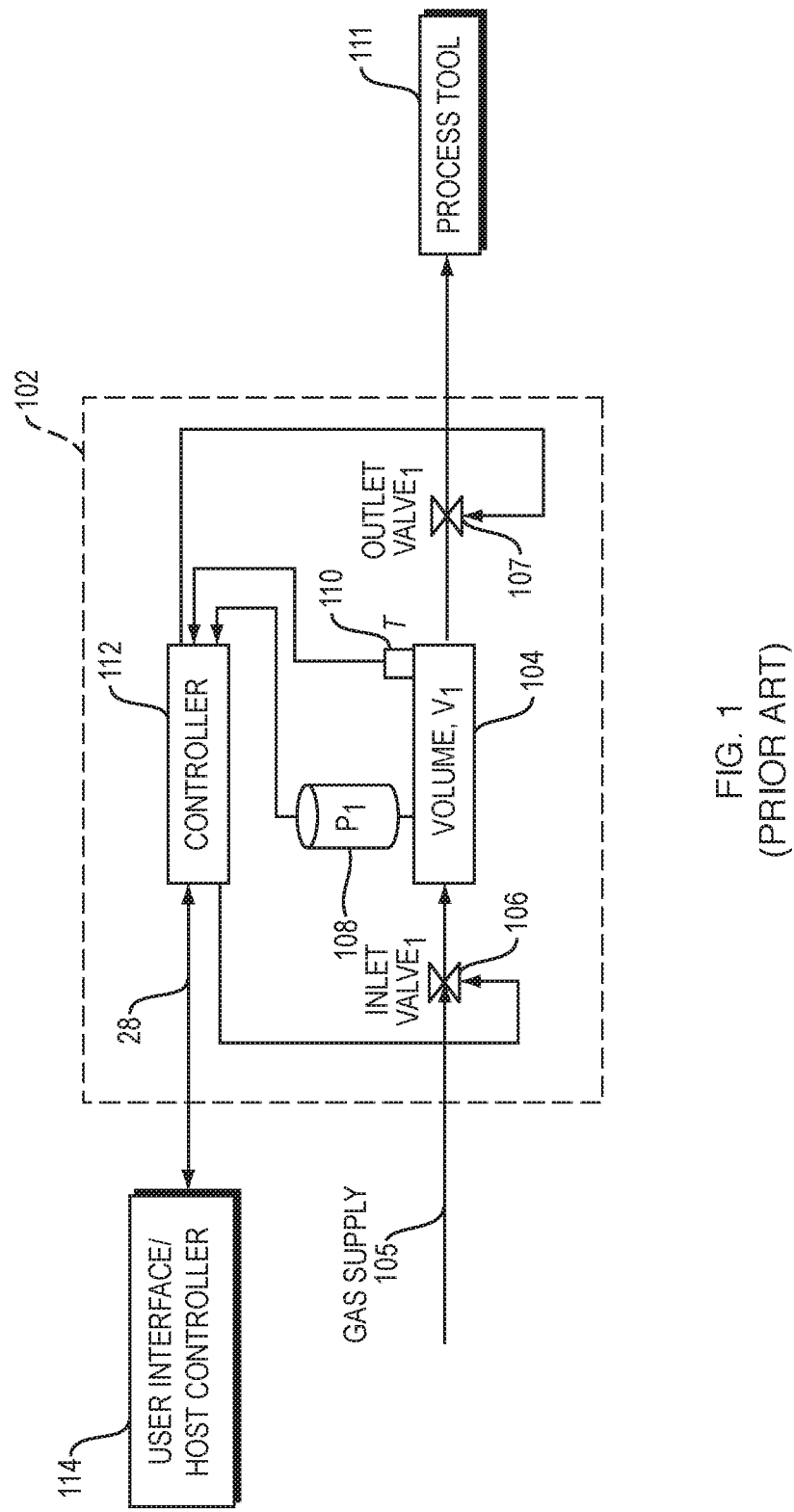
FIG. 1 illustrates a prior art pressure based pulse delivery system.

FIG. 1 illustrates a prior pulse gas delivery device 102 using pressure-based pulse gas delivery such as presented in U.S. Pat. No. 7,628,860, issued Dec. 8, 2009 to Shajii et al., the entire contents of which are incorporated by reference. Pressure based mole measurement techniques make use of a pressure (P) vs. time (t) response of a gas introduced into a known volume, as illustrated in FIG. 1. Device 102 includes a chamber 104 of a known volume (V), an inlet valve 106 ("Vin") located upstream of the chamber 104, and an outlet valve 107 ("Vout") located downstream of the chamber 104. Also provided are a pressure sensor 108 positioned at chamber 104 and a temperature sensor 110 that measures temperature of a wall of the chamber to provide an indication of gas temperature within the chamber.

Figure 2:
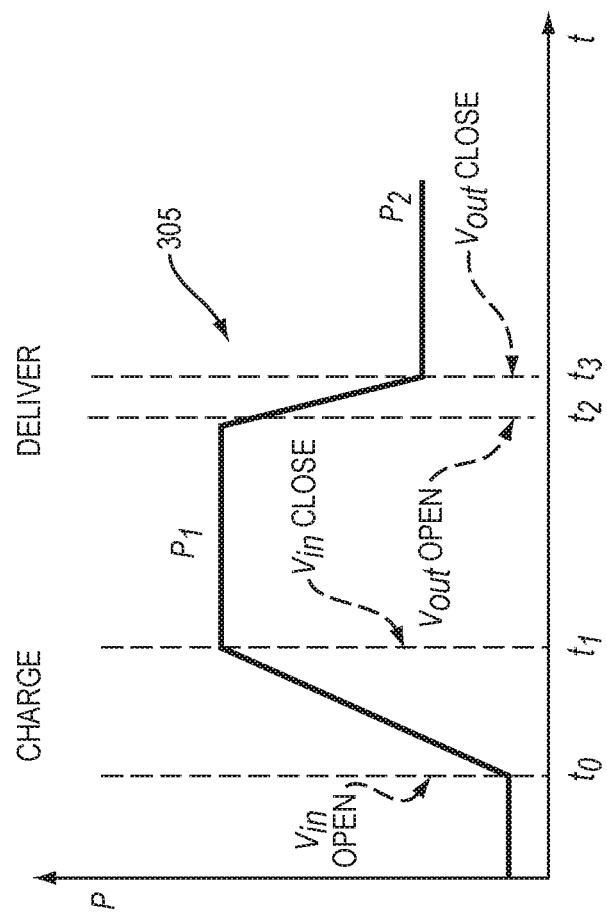
FIG. 2 illustrates operation of the pressure based pulse gas delivery system of FIG. 1.

Initially, the device 102 may be charged from a gas supply 105 to a predetermined pressure by opening upstream valve 106, while downstream valve 107 is closed, allowing a flow of gas ($Q_i$) to enter the device to fill the chamber or volume 104 over a period of time ("Charge" period $\Delta t = (t_1 - t_0)$, FIG. 2) and a change in pressure to occur. At time $t_1$ and pressure $P_1$, the upstream valve 106 is closed ("Vin CLOSE"). The process then includes a period ($t_2 - t_1$) in which the gas in the chamber 104 is allowed to stabilize to a set point. During this period, pressure and temperature measurements are obtained, by pressure sensor 108 and temperature sensor 110. Upon opening of the downstream valve 107 ("Vout OPEN" at time $t_2$, FIG. 2), a flow of gas ($Q_o$) exits the device 102 until the valve 107 is closed again ("Vout CLOSE" at time $t_3$), at a predetermined pressure $P_2$, delivering a pulse of gas from the device to a processing tool 111.

The pulse gas delivery illustrated in FIG. 2 can be implemented by a program on a dedicated controller 112 of device 102 that executes a delivery recipe commanded from a host controller 114. The pulse delivery is initiated by a trigger signal, e.g., a control signal from the host controller 114. The moles of delivered gas can be estimated based on the principal of ideal gas law, $\Delta n = (\Delta P * V)/(R * T)$.

Multiple channel pulse gas delivery employing flow rate determined based on a pressure drop within a delivery chamber is described in U.S. Pat. No. No. 9,348,339, issued May 24, 2016 to Ding et al., the entire contents of which are incorporated herein by reference.

The approach illustrated in FIGS. 1 and 2 has several limitations. The charging pressure must be tightly controlled. The accuracy and repeatability of pulse delivery are dependent on the speed and reliability of the downstream shut-off valve. A shut-off valve with a fast response time is desired. If the valve is aging, however, one may need to implement adaptive adjusting, which adds complexity, or one may need to replace the valve, which typically requires an interruption in the process. Often, the pulse shape (e.g., the pulse width) is not as desired or the pulse does not match a desired square wave sufficiently. Further, the need to charge the chamber 104 with a volume of gas requires time. The gas charge time and stabilization time prior to each pulse limit rapid gas delivery cycle time.

However, an advantage of pressure based mole measurement techniques is that they can be applied without knowledge of the specific gas or gas mixture being measured. The gas delivery amount, which is derived from a mass balance over the chamber volume and an application of the ideal gas law, is gas independent, relying on the three state variables of pressure (P), temperature (T), and volume (V) to characterize the behavior of the gas being measured.

Figure 3:
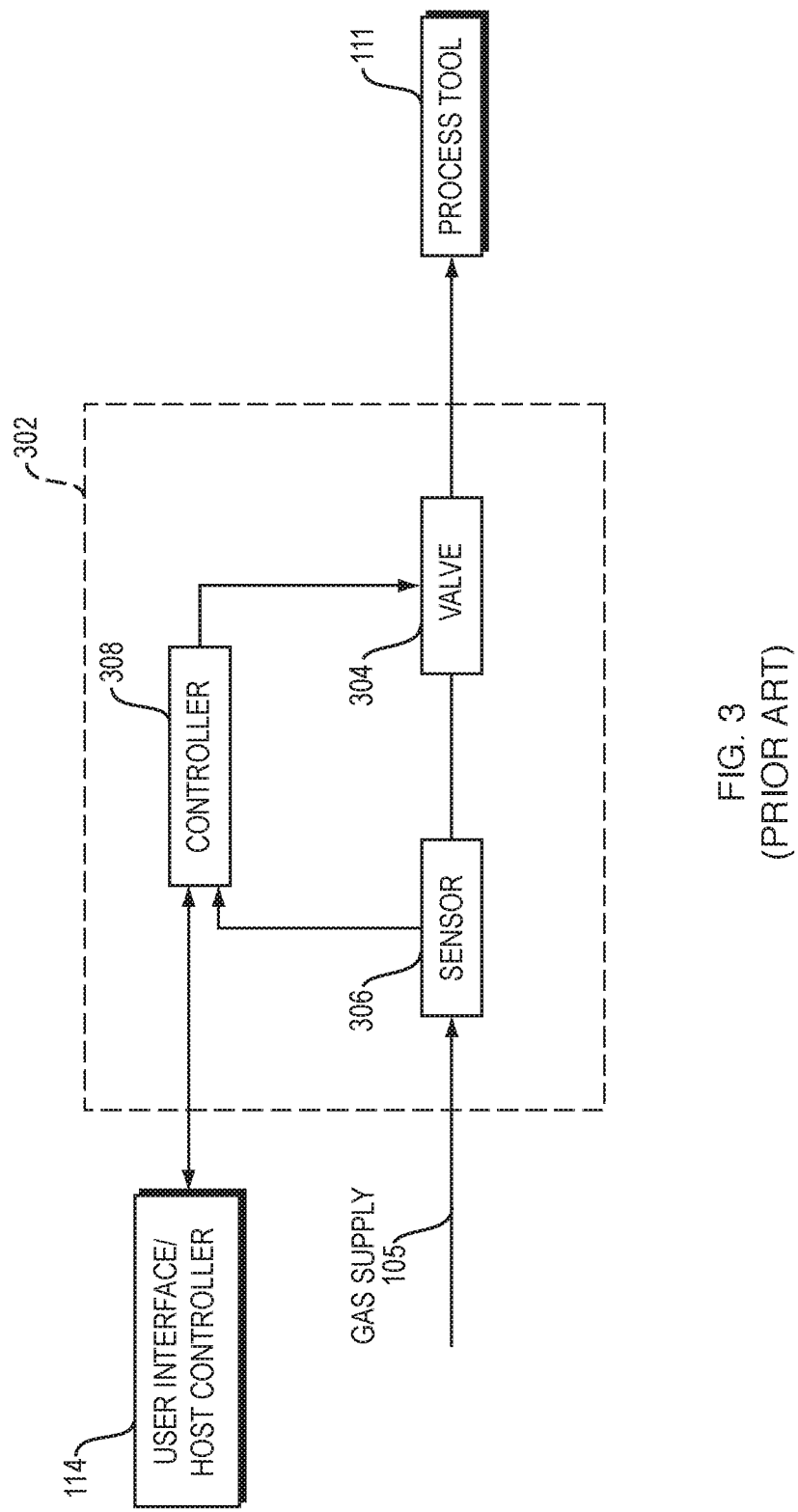
FIG. 3 illustrates a prior art pulsed mass flow controller using a thermal sensor.

FIG. 3 illustrates a prior pulse delivery system based on a mass flow controller. In a typical mass flow controller, a proportional control valve 304 is opened to a predetermined set point of flow that is sensed by a flow sensor 306. The flow sensor 306 may, for example, be a thermal based flow sensor. Feedback through the dedicated controller 308 is used to control the degree of openness of the proportional control valve 304 to meet the set point. In a pulse delivery system, a valve 304 that is able to open and close rapidly is used. The host controller 114 sends to the dedicated controller 308 the desired setpoint and the pulse on time. It may also send the pulse on and off times for a sequence of pulses initiated by a trigger from the host controller.

Disadvantages of thermal based pulse MFCs as illustrated in FIG. 3 are that they are limited from high temperature operation and can have a long-term drift issue.

Figure 4:
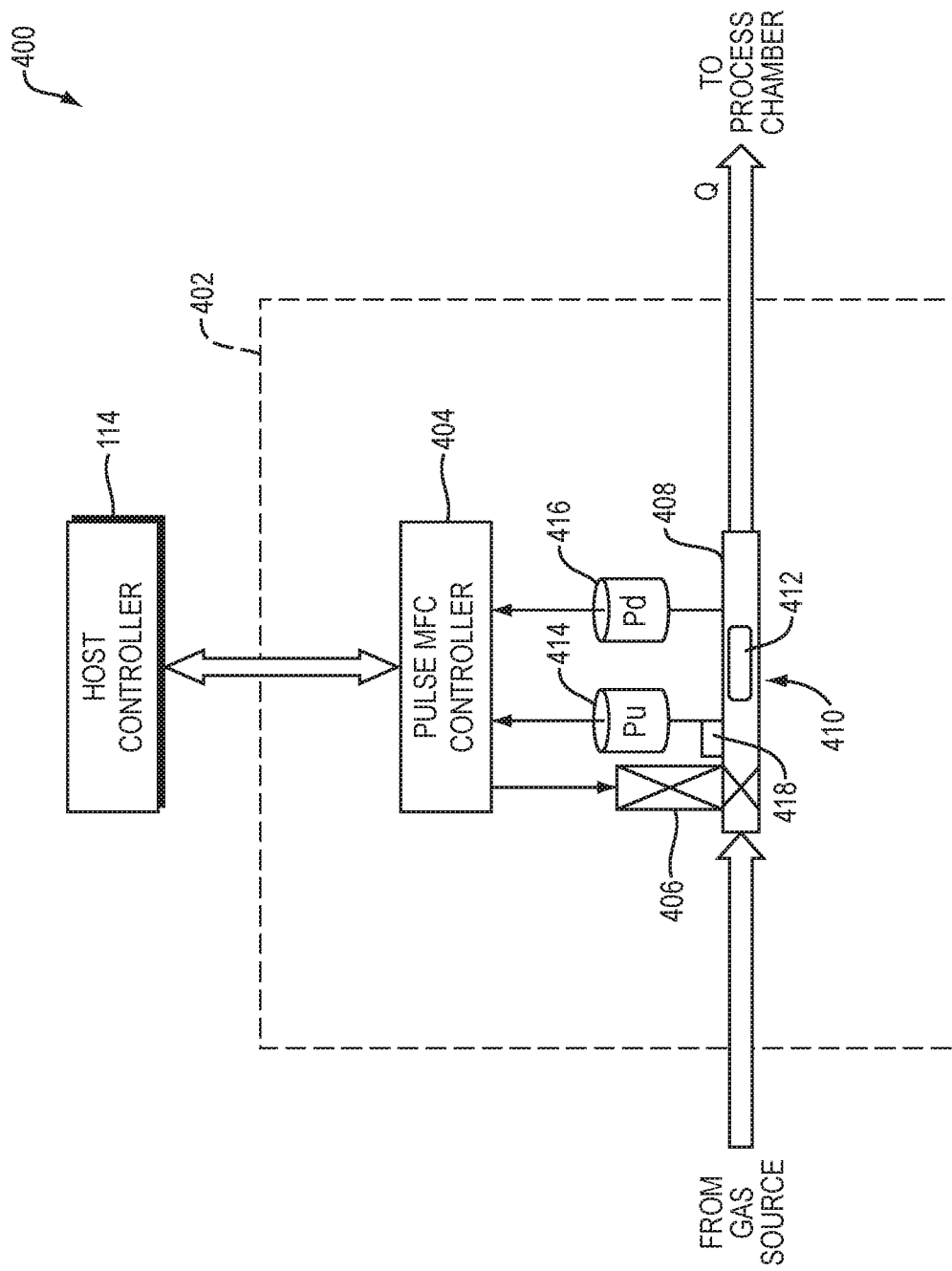
FIG. 4 illustrates a prior pulsed mass flow controller using a pressure-based flow sensor.

FIG. 4 illustrates a prior pressure based MFC 402 system for pulse delivery of a gas. A host controller 114 communicates with the MFC 402, e.g., to provide information regarding the desired pulse delivery information, such as pulse mole setpoint, pulse on period, pulse off period and number of repeated pulses, to the dedicated controller 404. To initiate a pulse delivery cycle, the host controller 114 sends a trigger signal to the dedicated controller 404. The MFC 402 includes a control valve 406 (e.g., a proportional control valve) to control flow of fluid from a gas source into a flow channel 408. The controller 404 of the MFC 402 is configured to control flow of fluid through the control valve 406 to control fluid delivered to a process chamber during the pulse of fluid. The controller 404 controls the flow of fluid through the control valve 406 based on feedback from a flow sensor 410, which is provided to measure flow rate (Q) in the flow channel. The flow sensor 410 includes a flow restrictor 412 within the flow channel 410 and upstream and downstream pressure sensors 414 and 416, respectively. The control valve 406 is upstream from the restrictor 412 and the pressure sensors. Flow control may also be responsive to a temperature sensor 418.

The pulse gas delivery amount for the devices in FIGS. 3 and 4 can calculated by the following equation:

$$\Delta n = \int_{t_1}^{t_2} Q \cdot dt \quad (1),$$

where $\Delta n$ is the delivered gas in mole, Q the measured flow rate by the flow sensor, $t_1$ the start time of the pulse, $t_2$ the end time of the pulse.

Pulse MFC gas delivery is further described in International Patent Publication No. WO 2012/116281 A1, entitled "System for and Method of Fast Pulse Gas Delivery" by Junhua Ding et al., the entire contents of which are incorporated herein by reference.

Improvements to the pressure based MFC of FIG. 4 are presented in the pending U.S. patent application Ser. No. 15/887,447, filed Feb. 2, 2018 and the corresponding PCT application PCT/US 2019/015356, filed Jan. 28, 2019. In that system, an isolation valve is provided at the output of the MFC to initiate and terminate pulses more rapidly than can be obtained with just the proportional control valve. The controller can be configured to control the flow through the control valve and the switching of the isolation valve based on the estimated number of moles of fluid delivered.

Figure 5:
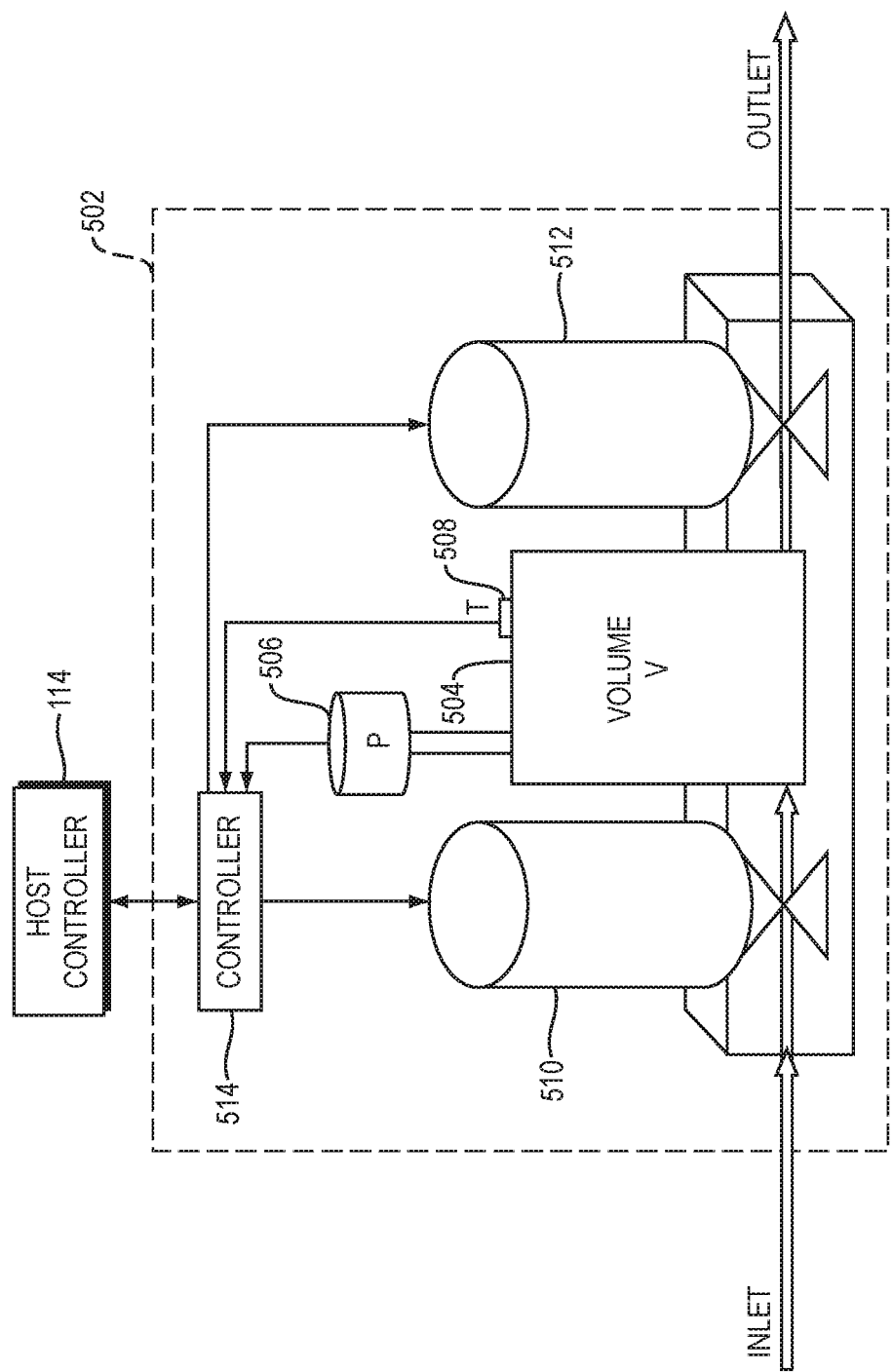
FIG. 5 illustrates a pulse delivery system embodying the present invention.

FIG. 5 illustrates an improvement to pressure based, rate-of-decay pulse gas delivery systems in accordance with the present invention. A chamber 504 has a known volume V. The pressure of fluid within the chamber 504 is sensed by a pressure sensor 506, and the gas temperature is sensed by a temperature sensor 508. Both sensed pressure and sensed temperature are fed to a dedicated controller 514 that communicates with a host controller 114. The controller 514 controls operation of an upstream valve 510 and a downstream valve 512. Upstream valve 510 can be a conventional on/off type isolation valve to charge the volume 504, but it could also be a control valve. Significantly, downstream valve 512 is not the typical on/off type isolation valve but is instead an adjustable control valve, the openness of which can be controlled in response to a control signal, such as a proportional control valve typically used in mass flow controllers.

Figure 6:
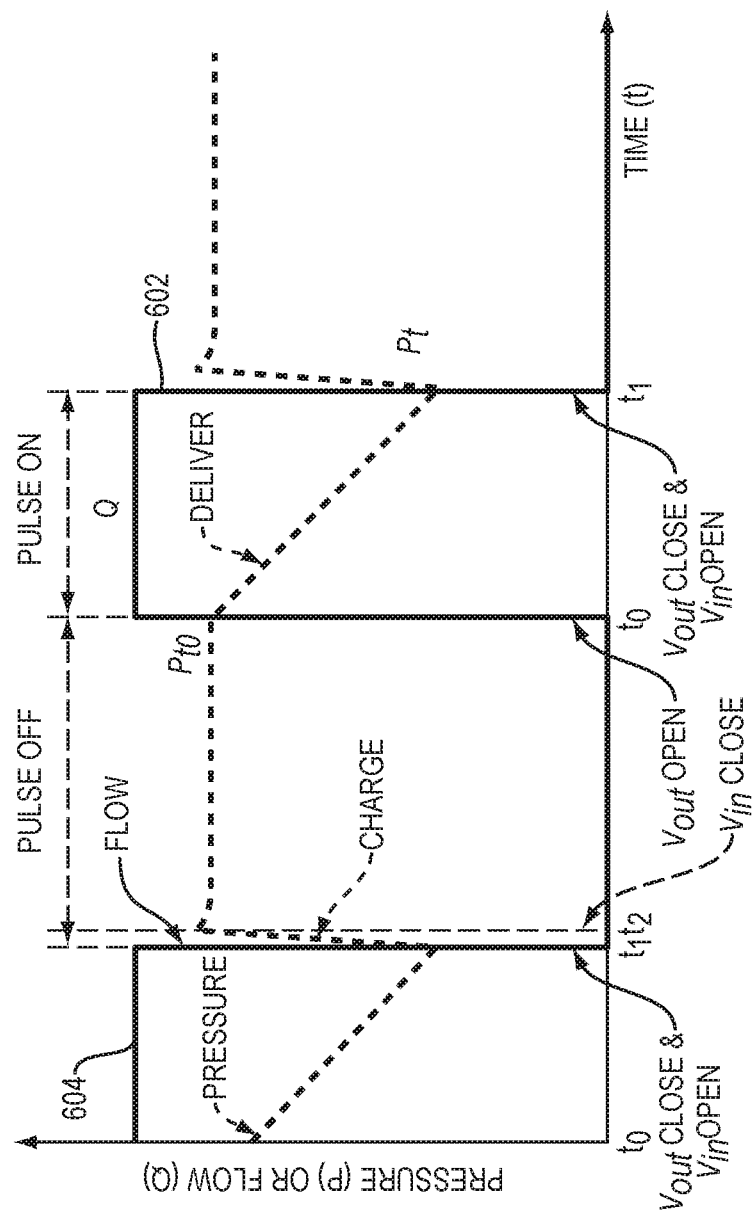
FIG. 6 illustrates operation of the system of FIG. 5.
Figure 7:
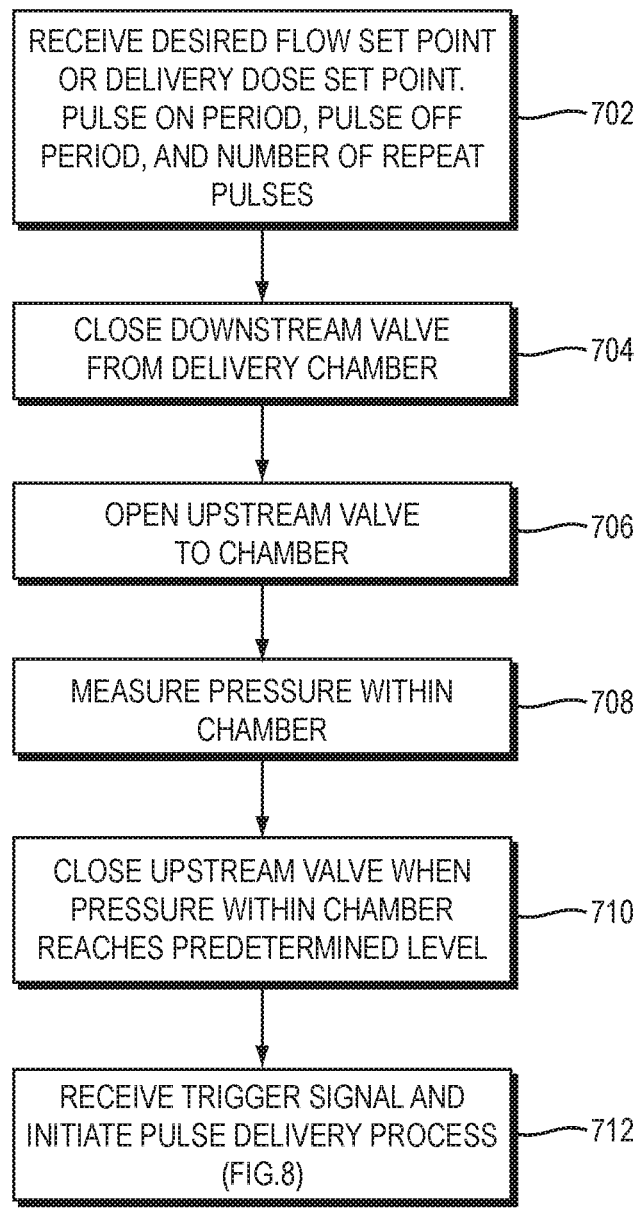
FIG. 7 is a flowchart illustrating operation of the pulse gas delivery system of FIG. 5.
Figure 8:
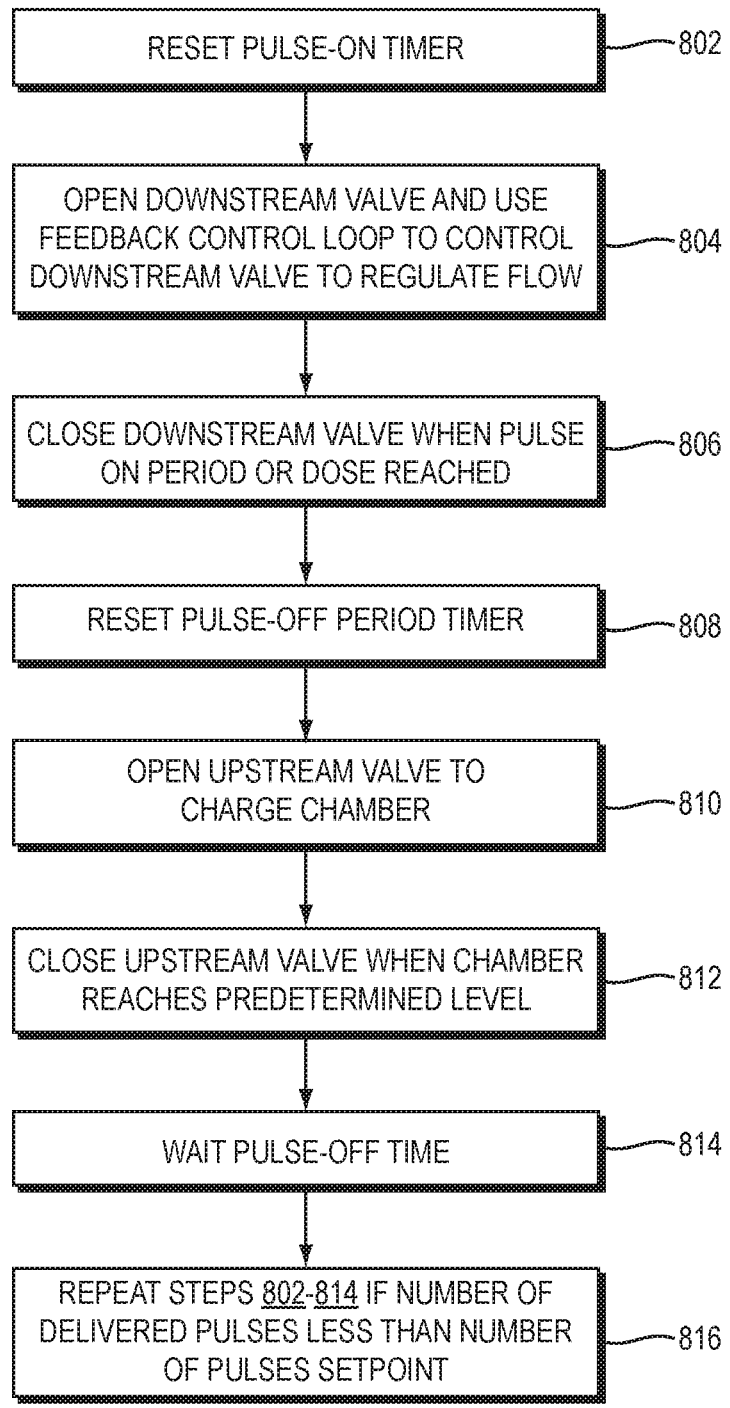
FIG. 8 is a flowchart illustrating the pulse delivery process of the system of FIG. 5

Operation of the pulse gas delivery system of FIG. 5 is illustrated in FIG. 6 and a control flowchart is presented in FIGS. 7 and 8. FIG. 6 illustrates a formation of a pulse of controlled flow 602 following a prior pulse 604.

At 702, the host controller sends parameters to configure the controller 514. Two alternative configurations are presented here. In "Time Based Delivery," the host controller sends the following parameters to the system: the flow setpoint (Qsp), the pulse on time (Ton), the pulse off time (Toff) and/or the number of pulses (N). In "Mole Based Delivery," the host controller sends the following parameters to the system: pulse delivery mole dose set point (Msp), pulse on time (Ton), pulse off time (Toff), and/or the number of repeat pulses (N). In this mole based delivery, assuming the pulse shape is rectangular, the targeted flow rate setpoint Qsp can be calculated from the mole dose set point (Msp) as:

$$Qsp = k1 * Msp / Ton \quad (2)$$

where k1 is a conversion constant.

Either method proceeds as follows. At 704, the downstream valve 512 is closed, and at 706 the upstream valve is opened to charge the chamber 504 to a predetermined pressure measured at 708. The upstream valve is then closed at 710. At 712, the host controller sends a trigger signal to the dedicated controller 514 to trigger the pulse gas delivery process of FIG. 8.

At 802, the pulse-on timer in the controller 514 is reset. At 804, time to in FIG. 6 at the start of pulse 604, the downstream valve 512 is opened and a feedback control loop is used to control the opening of the downstream valve in order to regulate the flow to the targeted flow setpoint (Qsp) based on the pulse dose setpoint and the pulse on period such that the pulse delivery meets the prescribed dose setpoint and pulse on period. The measured flow rate is calculated based on the rate of decay method on the delivery chamber volume as $$Q = -\frac{V \cdot T_{stp}}{P_{stp}} \frac{d\left(\frac{P}{T}\right)}{dt} \quad (3)$$

where Q is gas flow through the valve 512, V is the volume of the chamber 504, $T_{stp}$ is a standard temperature constant, $P_{stp}$ is a standard pressure constant, P is pressure measured by sensor 506, and T is temperature of the gas measured by the temperature sensor 508.

In the time based delivery method, as the pulse on time (Ton) is reached, the controller 514 closes the downstream valve 512 at 704 to finish delivery of a single pulse.

In the mole based delivery method, an additional feedback control loop is provided at 804. The gas delivery amount during the delivery pulse may be calculated using the following equation:

$$\Delta n(t) = \frac{V \cdot (P_{t0} - P_t)}{R \cdot T} \quad (4)$$

where Δn(t) is the moles of gas passed through the valve 512 with time, $P_{t0}$ is the initial charged pressure when the downstream valve is first opened, $P_t$ is the final pressure when the downstream valve is closed at $t_1$, T is the gas temperature and R is the ideal gas constant.

The system may estimate the total amount of gas to be delivered in moles when the pulse on period is reached.

The system may adjust the flow setpoint Qsp if this estimated value does not meet the mole setpoint Msp. In other words, a second feedback loop is used to adjust the flow setpoint Qsp. The first feedback control loop is always used to control the flow rate to the flow setpoint for both Time Based Delivery and Mole Based Delivery. In Mole Based Delivery, during pulse delivery, the controller 514 automatically adjusts the flow set point Qsp and thus the control valve 512 based on the feedback of the calculated number of moles delivered during the pulse in order to precisely deliver the desired number of moles within the targeted pulse-on period for each pulse. In Mole Based Delivery, the two feedback control loops can meet both the mole setpoint (Msp) and pulse on time (Ton) requirements.

The controller could also adjust the openness of the control valve 512 based on feedback of the previous pulse delivery.

At 806 and time $t_1$, the downstream control valve 512 is closed when the pulse-on period is elapsed or the dose amount is reached. In either method, at 808 the pulse-off timer is reset. At 810, and at time $t_1$, the upstream valve is opened to charge the volume of the chamber to a predetermined pressure. Although FIG. 6 shows the upstream valve being opened as soon as the downstream valve is closed, an appropriate delay may be provided. At 812, the upstream valve is closed when the prescribed pressure is reached at $t_2$. At 814, the system waits for the pulse off period as the gas in the chamber stabilizes. Because of the control provided by control valve 512, the starting pressure $P_{t0}$ after stability action is not as critical is in conventional rate-of-decay options. As a result, the pulse off time can be relatively short. At 816, the prior steps 802-814 are repeated if the number of delivered pulses is less than the number of pulses set point.

The disclosed system offers several advantages. It provides precise mole delivery amounts by controlling the flow rate during the pulse delivery period. Pulse shape can be controlled. High temperature operation is allowable. Fast charging can be achieved by fully opening the upstream valve. Flow rate and delivery amounts are gas independent; thus, the ideal gas equation can be used, although non-ideal gas equations could also be used. Because the dose of the moles delivered is computed during the pulse and flow can be controlled, the initial pressure $P_{t0}$ can be less precise. The system can be used in many fast pulse delivery applications such as ALD/ALE and TSV processes.

While example embodiments have been particularly shown and described, it will be understood by those skilled in the art that various changes in form and details may be made therein without departing from the scope of the embodiments encompassed by the appended claims.

What is claimed is:
1. A pulse gas delivery system comprising:
a chamber having a volume;
a pressure sensor configured to detect pressure of gas within the chamber;
a temperature sensor configured to detect a temperature indicative of temperature of the gas within the chamber;
an upstream valve configured to control flow of a gas into the chamber;
a downstream adjustable control valve, the openness of which can be controlled, configured to control flow rate of the gas out of the chamber; and
a controller configured to control the upstream valve and the downstream control valve to charge the chamber to an initial pressure and to thereafter control measured flow rate through the downstream control valve during a gas pulse of the gas flowing out of the chamber to control delivered dose and period of the gas pulse, measured flow rate being calculated from a rate of pressure decay calculation based on the detected pressure and temperature, and
wherein the controller is further configured to control the downstream control valve to regulate the measured flow rate of the gas out of the chamber calculated from the rate of pressure decay calculation during the gas pulse to a targeted flow rate set point.

2. The pulse gas delivery system of claim 1, wherein the controller is configured to control opening of the downstream control valve in a feedback loop to regulate the flow rate out of the system during the pulse based on pressure and temperature detected during the pulse.

3. The pressure based pulse gas delivery system of claim 1, wherein the controller is configured to calculate the flow rate Q based on the following function:

$$Q = -\frac{V \times T_{stp}}{P_{stp}} \frac{d\left(\frac{P}{T}\right)}{dt}$$

where V represents the volume of the chamber, $T_{stp}$ represents standard temperature, $P_{stp}$ represents standard pressure, P represents the pressure of the gas within the chamber, and T represents the temperature of the gas within the chamber.

4. The pulse gas delivery system of claim 1, wherein the controller is further configured to calculate a dose of the gas delivered out of the chamber and to control the downstream control valve to deliver a prescribed dose of gas during a prescribed period of the gas pulse.

5. The pulse gas delivery system of claim 4, wherein the controller is configured to calculate the dose of the gas delivered out of the chamber based on volume of the chamber, the initial pressure of the gas within the chamber as detected by the pressure sensor when the pulse is started, the pressure of the gas within the chamber as detected by the pressure sensor during the pulse, and the temperature of the gas as detected by the temperature sensor during the pulse.

6. The pulse gas delivery system of claim 5, wherein the controller is configured to calculate the dose Dn(t) of the gas delivered out of the chamber at a time t during the pulse according to the following function:

$$Dn(t) = V \times (P_{t0} - P_t)/(R \times T_t),$$

where V represents the volume of the chamber, $P_{t0}$ represents the pressure of the gas within the chamber when the pulse is started, $P_t$ represents the pressure of the gas within the chamber at the time t during the pulse, and $T_t$ represents the temperature of the gas at the time t during the pulse.

7. The pulse gas delivery system of claim 1, wherein the controller is further configured to calculate a dose of the gas delivered out of the chamber and to control the downstream control valve to deliver a prescribed dose of gas during a prescribed period of the gas pulse.

8. The pulse gas delivery system of claim 7, wherein the controller is configured to calculate the dose of the gas delivered out of the chamber based on the volume of the chamber, the initial pressure of the gas within the chamber as detected by the pressure sensor when the pulse is started, the pressure of the gas within the chamber as detected by the pressure sensor during the pulse, and the temperature of the gas as detected by the temperature sensor during the pulse.

9. The pulse gas delivery system of claim 8, wherein the controller is configured to calculate the dose Dn(t) of the gas delivered out of the chamber at a time t during the pulse according to the following function:

$$Dn(t) = V \times (P_{t0} - P_t)/(R \times T_t),$$

where V represents the volume of the chamber, $P_{t0}$ represents the pressure of the gas within the chamber when the pulse is started, $P_t$ represents the pressure of the gas within the chamber at the time t during the pulse, and $T_t$ represents the temperature of the gas at the time t during the pulse.

10. The pulse gas delivery system of claim 1, wherein the controller is configured to adjust the flow rate during the pulse to achieve a prescribed pulse shape.

11. The pulse gas delivery system of claim 1, wherein the controller is configured to adjust the downstream control valve to achieve a constant flow rate during the pulse.

12. A method of pulse gas delivery comprising:
(i) opening an upstream valve while closing a downstream adjustable control valve to charge a chamber with a gas to an initial pressure;
(ii) closing the upstream valve when the initial pressure is reached;
(iii) once the initial pressure is reached and after the upstream valve is closed, opening the downstream adjustable control valve to start a pulse of the gas flowing out of the chamber;
(iv) measuring flow rate from a rate of pressure decay calculation during the pulse of the gas based on pressure and temperature of the gas in the chamber; and
(v) controlling openness of the downstream adjustable control valve during the pulse of the gas flowing out of the chamber to regulate the measured flow rate from the rate of pressure decay calculation to a targeted flow rate set point during the pulse of the gas and to deliver a prescribed dose over a prescribed period of the pulse.

13. The method of pulse gas delivery as claimed in claim 12, further comprising detecting, during the pulse, pressure and temperature of the gas within the chamber and controlling the downstream control valve based on the detected pressure and temperature.

14. The method of pulse gas delivery as claimed in claim 12, further comprising controlling the downstream control valve to be closed when the prescribed dose of gas is reached.

15. The method of pulse gas delivery as claimed in claim 12, further comprising controlling the downstream control valve to be closed when a desired pulse on time is reached.

16. The method of pulse gas delivery as claimed in claim 12, further comprising repeating (i) to (iv) under control of a dedicated controller for a number of pulses.

17. The method of pulse gas delivery as claimed in claim 12 further comprising, during the pulse, computing a dose of gas delivered out of the chamber and controlling the downstream control valve to deliver a prescribed dose of gas during a prescribed pulse time.

18. The method of pulse gas delivery as claimed in claim 12 further comprising adjusting flow rate during the pulse to achieve a prescribed pulse shape.

19. The method of pulse gas delivery as claimed in claim 12 further comprising adjusting the downstream control valve during the pulse to achieve a constant flow rate during the pulse.

20. A method of delivering a pulse of gas, the method comprising:
opening an upstream valve while closing a downstream adjustable control valve to charge a chamber with a gas to an initial pressure;
closing the upstream valve when the initial pressure is reached;
once the initial pressure is reached and after the upstream valve is closed, opening the downstream adjustable control valve to start a pulse of the gas flowing out of the chamber;
detecting a pressure of the gas within the chamber with a pressure sensor;
detecting a temperature indicative of temperature of the gas within the chamber with a temperature sensor; and
regulating measured flow rate of the gas during the pulse of the gas flowing out of the chamber to a targeted flow rate set point by controlling the downstream adjustable control valve during the pulse of the gas, the measured flow rate being calculated from a rate of pressure decay calculation based on the detected pressure and temperature.

21. The method of claim 20, wherein controlling the flow rate of the gas through the downstream control valve is based on feedback from the pressure and the temperature detected during the pulse.

22. The method of claim 20, further comprising:
calculating the flow rate Q based on the following function:

$$Q = -\frac{V \times T_{stp}}{P_{stp}} \frac{d\left(\frac{P}{T}\right)}{dt},$$

where V represents volume of the chamber, $T_{stp}$ represents standard temperature, $P_{stp}$ represents standard pressure, P represents the pressure of the gas within the chamber, and T represents the temperature of the gas within the chamber.

23. The method of claim 20, further comprising:
calculating a dose of the gas delivered out of the chamber and controlling the downstream control valve to deliver a prescribed dose of gas during a prescribed period of the gas pulse.

24. The method of claim 20, further comprising:
calculating the dose of the gas delivered out of the chamber based on volume of the chamber, initial pressure of the gas within the chamber as detected by the pressure sensor when the pulse is started, the pressure of the gas within the chamber as detected by the pressure sensor during the pulse, and the temperature of the gas as detected by the temperature sensor during the pulse.

25. The method of claim 24, further comprising:
calculating the dose Dn(t) of the gas delivered out of the chamber at a time t during the pulse according to the following function:

$$Dn(t)=V\times(P_{t0}-P_t)/(R\times T_t),$$

where V represents the volume of the chamber, $P_{t0}$ represents the pressure of the gas within the chamber when the pulse is started, $P_t$ represents the pressure of the gas within the chamber at the time t during the pulse, and $T_t$ represents the temperature of the gas at the time t during the pulse.

26. The method of claim 20, further comprising:
adjusting flow rate during the pulse to achieve a prescribed pulse shape.

27. The method of claim 20, further comprising: adjusting the downstream control valve to achieve a constant flow rate during the pulse.

* * * * *